United States Patent
Brilmyer et al.

(12)

(10) Patent No.: US 6,762,610 B1
(45) Date of Patent: Jul. 13, 2004

(54) DEVICE AND METHOD FOR EVALUATING BATTERY CAN COATINGS

(75) Inventors: George H. Brilmyer, Cortland, OH (US); G. Robert Miller, Austintown, OH (US)

(73) Assignee: Thomas Steel Strip Corporation, Warren, OH (US)

( * ) Notice: Subject to any disclaimer, the term of this patent is extended or adjusted under 35 U.S.C. 154(b) by 354 days.

(21) Appl. No.: 09/620,859

(22) Filed: Jul. 21, 2000

(51) Int. Cl.[7] .............................................. G01R 27/08
(52) U.S. Cl. .................... 324/691; 324/433; 324/430; 324/426
(58) Field of Search ................... 324/425, 435, 324/691, 426, 430, 433, 88, 121 R; 429/206, 90, 199, 213, 323, 12, 13, 114; 427/77; 29/623.2; 381/323

(56) References Cited

U.S. PATENT DOCUMENTS 3,905,835 A * 9/1975 Kasai ......................... 429/206
4,544,457 A * 10/1985 Sane ............................ 204/67
5,580,675 A * 12/1996 Rouhani ....................... 429/90

* cited by examiner

Primary Examiner—Kamand Cuneo
Assistant Examiner—Trung Nguyen
(74) Attorney, Agent, or Firm—Hahn Loeser + Parks LLP; Stephen L. Grant

(57) ABSTRACT

The electrical resistance aging properties of a coating intended for use on a base material in a primary alkaline cell battery are be tested by manufacturing at least one test device, measuring a first and a second electrical resistance across two distinct circuits in the device, and calculating the effective electrical resistance at the interface between a cathode mix and a coated surface of the base material as the difference between the two electrical resistances. By storing the test device at temperatures above ambient, the aging properties of the coated surface resistance are estimated by repeating the electrical resistance measurements at predetermined time intervals at ambient temperature.

21 Claims, 2 Drawing Sheets

DEVICE AND METHOD FOR EVALUATING BATTERY CAN COATINGS

FIELD OF THE INVENTION

The present invention relates to a device and a method for evaluating the effectiveness of can coatings intended for use in a primary alkaline battery cell. In the method, it is possible to observe the electrical resistance changes that would occur at the can to cathode interface in a primary alkaline cell. A low can to cathode resistance is key to high rate performance in alkaline cells. The device and method negate the need to produce an actual primary alkaline cell to evaluate a prospective can coating. Candidate can coatings must also be tested for their ability to withstand "aging" in the battery while in the retail store supply chain for periods of up to two years or longer. The method of the present invention therefore incorporates an accelerated "aging" process whereby the device is exposed to an elevated temperature of 160° F. for a period of 28 days to simulate storage of 2 years at ambient temperature in the supply chain.

BACKGROUND OF THE ART

One of the critical variables in designing a high performance alkaline battery cell is the resistance to electrical current flow encountered at the interface between the inside surface of the battery can and the cathode mix contained within the can. More particularly, a coating applied to the inside surface of the metal can which effectively survives the oxidizing power of the cathode mix and the highly alkaline environment of the battery cell will in effect reduce the interfacial resistance and will result in a better battery. Coatings for the inside surface of the alkaline battery can are numerous and are receiving much attention. Metal coatings such as electroplated nickel (Thomas Steel Co. U.S. Pat. No. 2,115,750), electroplated nickel-cobalt (Hille & Muller U.S. Pat. No. 4,910,096) and carbon paint (Matsushita Electric U.S. Pat. No. 5,316,557, Rayovac U.S. Pat. No. 5,447,809 and Toyo Kohan U.S. Pat. No. 5,792,553) have all been shown to improve the high rate performance of an alkaline cell. Various combinations of plating, annealing and carbon painting have been shown to even further improve the performance of the alkaline cell as demonstrated by cell testing.

The capability of evaluating coatings for the interior of alkaline cells has until now, been limited to the alkaline battery manufacturers. In order to evaluate a potential new coating it was necessary in the past to produce an actual alkaline cell and test it under high rate conditions. Sometime these cells are "aged" at high temperature to simulate storage in the "supply chain". In either case, the can coating was evaluated for its ability to sustain high discharge currents. It is an unmet desire of the prior art to provide a proper test device and test method for measuring the time dependence of resistance as measured at the interface between the can and the cathode mix without the need for constructing an actual alkaline cell.

SUMMARY OF THE INVENTION

This advantage and other advantages of the present invention are provided by a method for manufacturing a device for evaluating the effectiveness of can coatings intended for use in a primary alkaline battery cell. Such a method comprises the steps of: (a) forming a cup and a test disk from a material, with the can coating applied to the interior surface of the cup and to one surface of the disk; (b) forming a lightly compacted disk of a simulated cathode mix in the cup; (c) placing the test disk onto the lightly compacted cathode mix such that the coated side of the metal disk is in electrical contact with the cathode mix disk, an opposite surface of the test disk is not in electrical contact with the cathode mix disk and the test disk is not in direct electrical contact with the cup; (d) compacting the contents of the cup tightly to create intimate electrical contact between the cathode mix and the test disk and the cathode mix and the interior surface of the cup; (e) forming a sealing cap from an electrically nonconductive material atop the test disk and the cathode mix in the cup to maintain the contents of the cup in a compacted state; and (f) providing electrical contact to a portion of the test disk.

Even further advantages of the invention are achieved by a device for evaluating the effectiveness of can coatings intended for use in a primary alkaline battery cell. The devices comprises a cup of a coated material, a disk of the coated material, an amount of simulated cathode mix; and a sealing cap. The coating is applied to an interior surface of the cup, and to at least one surface of the disk, either before or after the cup and disk are formed from a base material. The cathode mix is interposed between the interior surface of the cup and the coated surface of the disk and is compacted into intimate electrical contact with the both the disk and the cup in a manner that the disk is not in direct electrical contact with the cup. The sealing cap is formed from an electrically nonconductive material atop the disk and the compacted cathode mix in the cup to maintain the contents of the cup in a compacted state.

BRIEF DESCRIPTION OF THE DRAWINGS

The present invention will be best understood when reference is made to the accompanying drawings, wherein identical parts are identified by identical reference numerals and wherein.

DETAILED DESCRIPTION OF THE INVENTION

Figure 1:
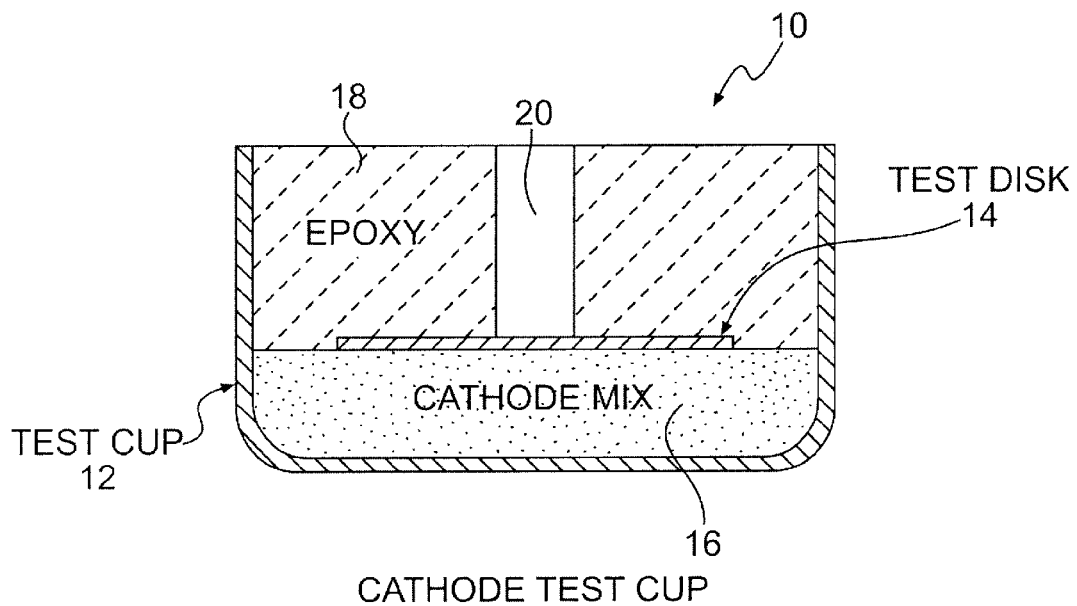
FIG. 1 shows a side sectional view of a first embodiment of a test device of the present invention.

FIG. 1 shows a side sectional view of a first embodiment of the present invention device 10. The device 10 comprises a test cup 12, a test disk 14, a lightly compacted disk 16 of a cathode mix and a polymeric sealing cap 18. The test cup 12 and test disk 14 are formed from a first disk and a second disk of the coated can material to be tested. The material is coated on one side of its generally planar shape. In this embodiment, the first disk will be larger than the second disk. For example, in one aspect of this embodiment, a first disk of 7.62 cm diameter is drawn to form the test cup 12, with the coating on the inside surface of the cup. The second disk, having a 2.0 cm diameter, remains in its planar shape to act as test disk 14. For this size cup 12 and disk 14, approximately 20 g of the cathode mix in a powdered form is added to the cup. The cathode mix is lightly compacted to form the lightly compacted disk 16 of cathode mix, such that a flat surface essentially parallel to the bottom of the test cup is provided.

The second disk, acting as the test disk 14, is laid atop this upper flat surface of the light compacted disk 16 of cathode mix, the coated surface of the test disk in contact with the disk of cathode mix. The test disk 14 has a smaller diameter than the diameter of the test cup, as shown in FIG. 1, and the test disk is positioned to be not in direct contact with the test cup 12. The cathode mix disk 16 has a significantly smaller volume than the test cup 12, so an amount of empty volume still exists in the test cup even after the cathode mix disk is formed therein.

With the cathode mix disk 16 and the test disk 14 placed in the test cup 12, an amount of a curable polymer is placed into the empty volume atop the cathode mix disk and the test disk. In one aspect of the invention, this curable polymer will be a thermosetting epoxy powder. Using conventional polymer processing techniques, the epoxy powder is compacted under pressure and heated in a molding die to melt the epoxy powder, thereby forming the electrically non-conductive sealing cap 18, which will adhere to the internal walls of the test cup. The completed device 10 is then cooled and removed from the die. If excess sealing cap material has been used, this may be removed. A test hole 20 is bored through the sealing cap 18 to expose a rear portion of the test disk 14. The diameter of the test hole 20 will typically be about one-quarter of less of the diameter of the test disk 14. The test hole 20 is carefully drilled so that the test disk 14 is not drilled through. Once the rear surface of the test disk 14 is so exposed, a flat bottom drill bit may be used to ream out the test hole 20. A second hole may also be drilled close to the cup wall in such a manner so as not to hit the test disk. This hole can be used to introduce a third electrode which can be used as a reference electrode for various types of impedance and electrochemical measurements.

Figure 2:
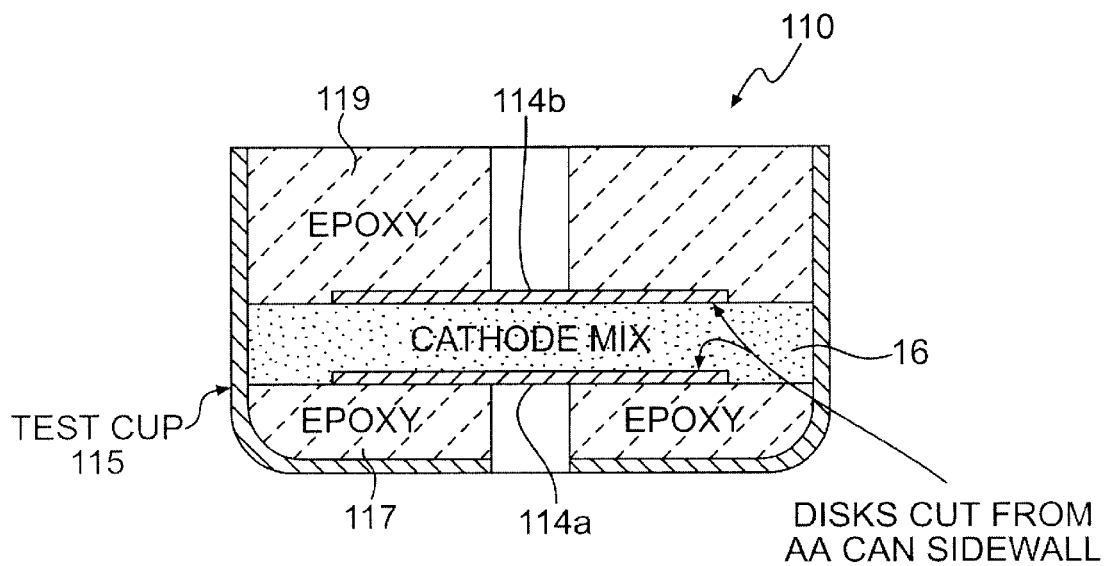
FIG. 2 shows a side sectional view of a second embodiment of the present invention.

In a similar fashion, FIG. 2 shows a side sectional view of a second embodiment of the present invention device 110. The device 110 comprises a pair of test disks 114, a support cup 115, a lightly compacted disk 16 of a cathode mix and first and second polymeric sealing caps 117 and 119. In this case, the pair of test disks 114 are formed from a first disk and a second disk cut from a coated and drawn battery can formed from the material to be tested. In this manner, the ability of the coating to withstand the stresses of the drawing process may be measured. The pair of disks 114 will usually be identical in size. In the aspect illustrated, the pair of test disks 114 will be about 2.0 cm in diameter. A support cup 115 is formed from a sheet of metal (typically 0.010" thick steel). The support cup 115 has a first portion of a cureable polymer, especially a thermosetting epoxy resin, placed in it. The first of the pair of test disks 114a is placed atop the polymeric sealing cap 117 and about approximately 20 g of the cathode mix in a powdered form placed atop the sealing cap 117 and the first test disk 114a. The cathode mix is lightly compacted to form the lightly compacted disk 16 of cathode mix, such that a flat surface essentially parallel to the bottom of the test cup 115 is provided. The second of the pair of test disks 114b is then laid atop this upper flat surface of the light compacted disk 116 of cathode mix. With each of the test disks 114, the coated surface thereof is placed in contact with the disk 116 of cathode mix, that is, the coated surface of test disk 114a faces upwardly and the coated surface of test disk 114b faces downwardly in FIG. 2. An additional amount of the thermosetting polymer is placed into the empty volume in test cup 115 atop the cathode mix disk 116 and the second test disk 114b. Using conventional polymer processing techniques, the test cup and contents 115 are heated under pressure in a molding die to melt the epoxy powder, thereby forming the polymeric sealing caps 117 and 119, which will adhere to the internal walls of the test cup 115. The completed device 110 is then cooled and removed from the die. If excess epoxy has been used, this may be removed. A first test hole 120 is bored through the sealing cap 117 to expose a portion of the first test disk 114a and a second test hole 122 is drilled through second polymeric sealing cap 119. The diameter of the test holes 120, 122 will typically be about one-fourth of less of the diameter of the test disks 114. The test holes 120, 122 are carefully drilled so that the test disk 114 is not drilled through. Once the surface of the test disk 114 is so exposed, a flat bottom drill bit may be used to ream out the test holes 120, 122. In other aspects of the invention, it may be desirable to cast or mold a void into the sealing cap so that a portion of the test disk surface is exposed. In yet other aspects of the invention, it may be desirable to weld or solder an electrical wire to the test disk surface, with the wire extending out through the sealing cap to communicate an electrical contact therethrough.

The cathode mix which is used to prepare the lightly compacted disks 16, 116 of the respective embodiments is a mixture of manganese dioxide, graphite and potassium hydroxide, in a blend which will be known to those of skill in this art. Clearly, the exact composition, particle size and other aspects of the cathode mix will vary according to proprietary specifications set by a specific battery design. The individual ingredients should be finely powdered so as to enhance contact between the mix and the test disks.

Figure 3:
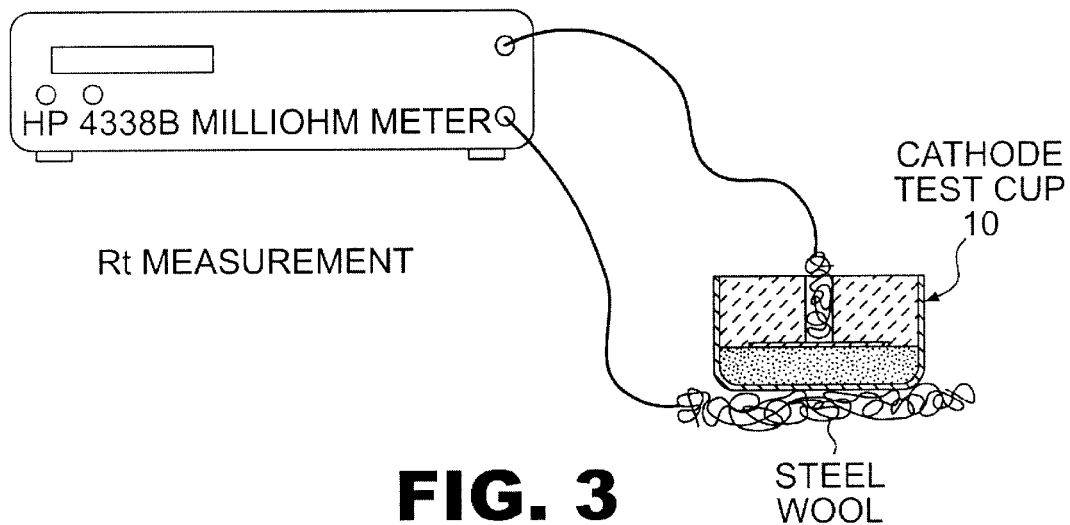
FIG. 3 shows a test set-up for conducting a first resistance measurement of the invention.
Figure 4:
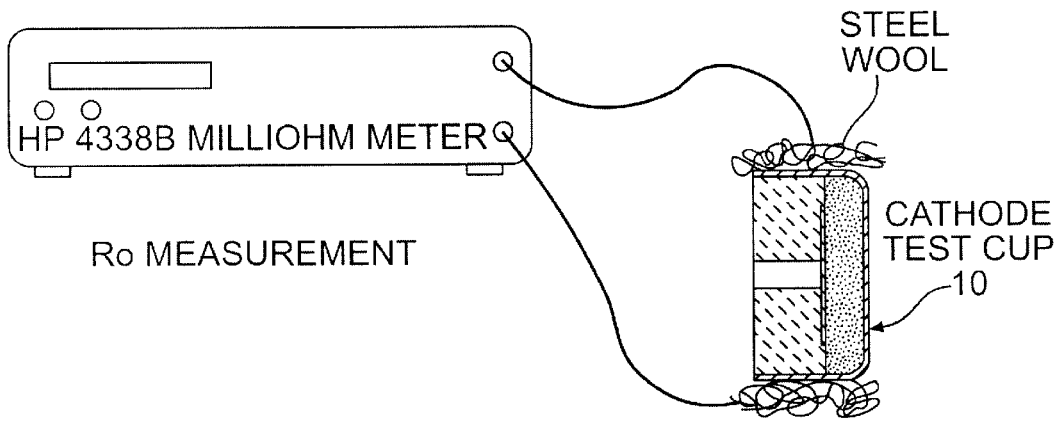
FIG. 4 shows a test set-up for conducting a second resistance measurement of the invention.

The test devices 10, 110 have been designed for testing the electrical resistance behavior over time of the coated materials used in the test disks. The overall electrical resistance of a circuit may be broken out into a series of individual resistances, the overall resistance representing the sum of the individual component resistances. In the particular test method illustrated in FIG. 3, the contacting surface of the test disk 14 inside the test hole 20 and the contacting surface of the test cup are lightly polished with a steel wool (grade 000) to remove any oxides formed thereon. Then, a plug of steel wool is inserted into the test hole to serve as an electrical contact. A clean, flat pillow of steel wool is placed under the device 10, so that the test cup 12 sits atop the pillow. When the respective contacts of a milli-ohmmeter (such as a Hewlett Packard model 4338B) are attached to the steel wool plug and the steel wool pillow, a first resistance ($R_t$) of this first circuit will represent the sum of: the resistance in the steel wool plug; the contact resistance at the steel wool/test disk interface; the resistance in the test disk; the contact resistance at the test disk/cathode mix interface; the resistance of the cathode mix; the contact resistance at the test cup/cathode mix interface; the resistance in the test cup; the contact resistance at the steel wool/test cup interface; and the resistance in the steel wool pillow. In a similar fashion, if a pair of the steel wool pillows are placed at separate points on the cup, the points being shown as the opposite sides of the cup 14 of device 10 as shown in FIG. 4, the second resistance ($R_o$) measured by the milli-ohmmeter will represent the sum of: the resistance in the first steel wool plug; the contact resistance at the first steel wool/test cup interface; the resistance in the test cup; the contact resistance at the second steel wool/test cup interface; and the resistance in the second steel wool pillow. When certain simplifying assumptions are made, such as the equivalence of all resistances in the steel wool, the equivalence of the resistances at all steel wool interfaces with the test cup or test disk, and the equivalence of all resistances in the test cup or test disk, it is seen that the difference of the two measured resistances is equal to a multiple of the contact resistances at the test cup to cathode mix interface and the test disk to cathode interface. For simplicity we divide by 2 to represent the resistance at the disk to cathode interface.

Put into an equation $R_{cc}=(R_t-R_o)/2$ where $R_{cc}$ represents the combined contact resistance at the cup/cathode mix/disk interface.

When a device 110 is used, the resistance of the first circuit may be measured by connecting the two electrical contacts of the milli-ohmmeter to the exposed surfaces of the first and second test disks with plugs of steel wool rather than using the exterior cup surface as a contact point.

Hence, by manufacturing test devices 10 or 110 and measuring these two resistances over time, the time effect on the contact resistance of a cathode mix interface with a coated can is measured.

The appropriate test protocol is to prepare five identical test devices 10 or 110, and to determine the interface resistance of each before aging, by measuring the first and second resistances of each. Rather than aging at room temperature, the test devices 10 or 110 are stored in an oven at 160° F. and removed at intervals, such as weekly and cooled to room temperature for testing. Over a period of approximately twenty-eight days at these temperatures, the interface resistance will change sufficiently to simulate two years of aging at room temperature. The testing comprises: allowing the test devices to cool to ambient, measuring the first and second resistances, and returning the test devices to the oven. By preparing five test devices, the natural dispersion or variability of the data may be considered.

EXAMPLE 1

A cup 10 was formed by deep drawing a flat section of 0.010" thick steel that had been electroplated with 70 micro-inches of nickel using a Watts bath and then diffusion annealed. The deep drawn cup had an inside diameter of 3.3 cm and a depth of 2.16 cm. A 20 g amount of simulated cathode mix was prepared and added to the cup. The simulated cathode mix comprised by weight: 82.5% $MnO_2$, 7.24% graphite and 10% of 45% aqueous potassium hydroxide. The cathode mix was lightly compacted to fill the cup to a uniform level. A 2.2 cm diameter disk was cut from the 0.010" nickel plated steel. The disk was placed onto the cathode mix and centered within the inside diameter of the cup making certain that the disk did not touch the interior of the cup. The cup was now placed into a forming die which is designed to fit the outside diameter of the cup. A powered thermosetting epoxy amounting to about 22 g was added to the cup to cover the exposed surface of the disk and to fill the cup beyond its limits. The ram of the forming die was placed into the cup and the assembly was placed into a hydraulic press, where the layered mixture was compacted into the cup at an applied force of 3,000 pounds per square inch. An electric heater was used to heat the cup, die and ram above the melting point of the thermosetting epoxy. As the epoxy became molten, the measured force notably decreased and more hydraulic force was applied to maintain the desired 3,000 pounds per square inch. The heater was removed and the assembly was permitted to cool to room temperature under the applied force. When cooled, the assembly was removed from the die and a hole was carefully drilled through the epoxy to expose the rear surface of the metal disk.

Five devices 10 were produced in the above manner. The combined contact resistance $R_{cc}$ as defined above was measured for each of the 5 devices, and the initial value was observed to be approximately 0.65 ohms. The 5 devices were then placed into the aging furnace at 160 degrees F. At specific times during the aging period, the 5 devices were removed from the furnace and permitted to cool for 2 hours, after which resistance $R_{cc}$ was determined. After 28 days of aging, the test was completed, the final $R_{cc}$ having been attained. In this particular example, $R_{cc}$ was 31.9 ohms after 28 days.

EXAMPLE 2

A flat section of 0.010" nickel plated steel was deep drawn into the shape of a cup with an inside diameter of 3.3 cm and a depth of 2.16 cm. 5 grams of thermosetting epoxy powder was added to the cup and lightly but evenly compacted. A first, 2.2 cm diameter, metal disk having a gold plated coating on one side was placed onto the epoxy with the gold plated side facing away from the epoxy, with the disk centered with the inside diameter of the cup so that the disk did not touch the interior of the cup. 20 grams of simulated cathode mix was prepared and added to the cup. The cathode mix comprised by weight: 82.5% $MnO_2$, 7.24% graphite and 10% of 45% aqueous potassium hydroxide. The cathode mix was lightly compacted to uniformly cover the first disk. A second disk, also 2.2 cm diameter and also having a gold plated coating on one side, was placed onto the cathode mix with the gold plated side facing the cathode mix. In this way, the gold plated surfaces simulated gold plated internal can surfaces in a battery can. The disk was placed onto the cathode mix and centered within the inside diameter of the cup so that the disk did not touch the interior of the cup. The metal cup was placed into a forming die designed to fit the outside diameter of the cup. 17 grams of a powered thermosetting epoxy was added to the cup to cover the exposed surface of the second metal disk and fill the cup beyond its limits. A ram was placed into the die and the assembly was placed into a hydraulic press. The press was used to compact the layered mixture into the cup at an applied force of 6,000 pounds per square inch. An electric heater was used to heat the cup, die and ram above the melting point of the thermosetting epoxy. As the epoxy becomes molten, the measured force notably decreased and it was necessary to apply more hydraulic force to maintain the desired 6,000 pounds per square inch. The heater was removed and the assembly was permitted to cool to room temperature under the applied force. When cool, the assembly was removed from the die. A hole was carefully drilled through the bottom of the metal can, through the thermosetting epoxy to expose the rear surface of the first disk. A hole was also carefully drilled through the epoxy to expose the rear surface of the second metal disk. After 28 days of aging at 160 F, resistance $R_{cc}$ was measured at a frequency of 100 Hz using a Zahner IM6e Workstation and was determined to be 1.04 ohms.

While the foregoing specification has described the present invention in the clear manner required by law and has described the best mode known to the inventors at the time of filing, the scope of the patent protection obtained is to not be measured by the specification, but is instead to be determined by the accompanying claims.

What is claimed is:

1. A method for manufacturing a device for evaluating the effectiveness of can coatings intended for use in a primary alkaline battery cell, said method comprising the steps of:

forming a cup and a test disk from a material, with the can coating applied to the interior surface of the cup and to one surface of the disk;

forming a lightly compacted disk of a simulated cathode mix in the cup;

placing the test disk onto the lightly compacted cathode mix such that the coated side of the metal disk is in electrical contact with the cathode mix disk, an opposite surface of the test disk is not in electrical contact with the cathode mix disk and the test disk is not in direct electrical contact with the cup;

compacting the contents of the cup tightly to create intimate electrical contact between the cathode mix and the test disk and the cathode mix and the interior surface of the cup;

forming a sealing cap from an electrically nonconductive material atop the test disk and the cathode mix in the cup to maintain the contents of the cup in a compacted state; and providing electrical contact to a portion of the test disk.

2. The method of claim 1 wherein the can coating is applied to the material prior to forming the cup and the test disk.

3. The method of claim 1 wherein the can coating is applied to the material after forming the cup and the test disk.

4. The method of claim 1 wherein the can coating is applied to the material by electroplating.

5. The method of claim 1 wherein the can coating is applied to the material by painting.

6. The method of claim 1 wherein the material is a low carbon steel.

7. The method of claim 1 wherein the electrically nonconductive sealing material is a thermally cured epoxy.

8. The method of claim 1 wherein the electrically nonconductive sealing material is a two component epoxy.

9. The method of claim 1 wherein the step of providing electrical contact to the test disk comprises drilling through a portion of the sealing cap.

10. The method of claim 1 wherein the step of providing electrical contact to the test disk comprises casting or molding a void in the sealing cap.

11. A device for evaluating the effectiveness of can coatings intended for use in a primary alkaline battery cell, comprising:

a cup of a coated material, the coating applied to an interior surface of the cup, a disk of the coated material, with the coating applied on one surface thereof;

an amount of simulated cathode mix, interposed between the interior surface of the cup and the coated surface of the disk such that the cathode mix is compacted into intimate electrical contact with both the disk and the cup, but the disk is not in direct electrical contact with the cup; and a sealing cap from an electrically nonconductive material atop the disk and the compacted cathode mix in the cup to maintain the contents of the cup in a compacted state.

12. The device of claim 11 wherein the can coating is applied to the material prior to forming the cup and the disk.

13. The device of claim 11 wherein the can coating is applied to the material after forming the cup and the disk.

14. The device of claim 11 wherein the coating is applied to the material by spraying or roll coating a conductive liquid or paint onto the surface.

15. The device of claim 11 wherein the material is a low carbon steel.

16. The device of claim 11 wherein the electrically nonconductive sealing material is a thermally cured epoxy.

17. The device of claim 11 wherein the electrically nonconductive sealing material is a two component epoxy.

18. The device of claim 11 wherein electrical contact to the disk is provided by drilling through a portion of the sealing cap.

19. The device of claim 11 wherein electrical contact to the disk is provided by casting or molding a void in the sealing cap.

20. The device of claim 11 therein the device further comprises:

a layer of electrically nonconductive sealing material formed in the cup, covering at least the bottom and a portion of the interior surface thereof; and a second disk of the material, with the coating applied on one surface thereof, wherein the second disk is placed atop the sealing material layer such that the coated surface of the second disk is in intimate compacted electrical contact with the cathode mix, an opposite surface thereof is not in electrical contact with the cathode mix and the second disk is not in direct electrical contact with the cup or the first disk.

21. A method of measuring an electrical contact resistance of a coating on a material using an ohmmeter having first and second electrical contacts, said method comprising the steps of:

a) providing a test device comprising a cup and at least one test disk, both the cup and the test disk manufactured from the material, the cup having the coating disposed on an interior surface thereof and the at least one test disk having the coating disposed on at least one surface thereof, the cup and at least one test disk separated from each other but having the coated surface of each in intimate electrical contact with a compacted amount of cathode mix to define an electrical cell, an exterior surface of the cell and a test disk surface not in contact with the cathode mix being exposed for connection of one of the electrical contacts thereto;

b) allowing the test device to reach ambient temperature;

c) creating a first electrical circuit by attaching the first contact of the ohmmeter to the exposed test disk surface and the second contact to the cup exterior surface and measuring the electrical resistance of the first circuit as a first resistance;

d) creating a second electrical circuit by attaching the first contact of the ohmmeter to a first point on the exposed cup exterior surface and the second contact to a second point on the cup exterior surface and measuring the electrical resistance of the second circuit as a second resistance;

e) determining the electrical contact resistance of the coating, defined as one-half the difference of the first and second resistances;

f) storing the test device at an elevated temperature for a predetermined time interval; and g) repeating steps b) through g) for a predetermined number of the predetermined time intervals.

\* \* \* \* \*

UNITED STATES PATENT AND TRADEMARK OFFICE
CERTIFICATE OF CORRECTION

PATENT NO. : 6,762,610 B1 Page 1 of 1
DATED : July 13, 2004
INVENTOR(S) : Brilmyer et al.

It is certified that error appears in the above-identified patent and that said Letters Patent is hereby corrected as shown below:

Title page,
Item [*] Notice, delete "by 354 days" and insert -- by 0 days --

Signed and Sealed this

Twenty-sixth Day of July, 2005

JON W. DUDAS
*Director of the United States Patent and Trademark Office*